US008659218B2

(12) United States Patent
Hwang et al.

(10) Patent No.: US 8,659,218 B2
(45) Date of Patent: Feb. 25, 2014

(54) ORGANIC LIGHT EMITTING DISPLAY DEVICE

(75) Inventors: Kyu-Hwan Hwang, Yongin (KR);
Seok-Gyu Yoon, Yongin (KR);
Jae-Heung Ha, Yongin (KR);
Young-Woo Song, Yongin (KR);
Jong-Hyuk Lee, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 533 days.

(21) Appl. No.: 12/980,425

(22) Filed: Dec. 29, 2010

(65) Prior Publication Data
US 2011/0169720 A1 Jul. 14, 2011

(30) Foreign Application Priority Data
Jan. 8, 2010 (KR) .................. 10-2010-0001885

(51) Int. Cl.
*H01L 51/50* (2006.01)
*H01L 51/52* (2006.01)

(52) U.S. Cl.
USPC ............ 313/504; 313/505; 313/506; 313/509

(58) Field of Classification Search
USPC ................................. 313/500–512
See application file for complete search history.

(56) References Cited

U.S. PATENT DOCUMENTS

| 5,739,545 | A | 4/1998 | Guha et al. |
| 6,765,641 | B1 | 7/2004 | Kubo et al. |
| 7,609,310 | B2 * | 10/2009 | Miyagawa .................. 345/102 |
| 7,619,258 | B2 * | 11/2009 | Tsuchiya et al. ............. 313/504 |
| 2002/0072139 | A1 | 6/2002 | Kashiwabara et al. |
| 2003/0197179 | A1 | 10/2003 | Yamazaki et al. |
| 2005/0133802 | A1 | 6/2005 | Lee et al. |

(Continued)

FOREIGN PATENT DOCUMENTS

| JP | 11004003 A | 1/1999 |
| JP | 2000-113981 | 4/2000 |

(Continued)

OTHER PUBLICATIONS

Song et al. "LTPS-based Transparetn AM OLED" SID 10 Digest vol. 41, Issue 1, pp. 144-147, May 2010.*

(Continued)

*Primary Examiner* — Mariceli Santiago
(74) *Attorney, Agent, or Firm* — Robert E. Bushnell, Esq.

(57) ABSTRACT

An organic light emitting display device that can prevent distortion of an image transmitted therethrough by preventing light scattering. The organic light emitting display device includes a substrate in which a plurality of transmitting regions and a plurality of pixel regions are defined. The plurality of pixel regions are spaced apart from each other by the transmitting regions. A passivation layer is formed in all the plurality of transmitting regions and the plurality of pixel regions. A first aperture is formed in a location on the passivation layer, which corresponds to an at least part of the plurality of transmitting regions; a plurality of pixel electrodes that are formed on the passivation layer and are disposed to overlap and cover the thin film transistors. An opposite electrode formed to face the plurality of pixel electrodes and to allow light to pass therethrough. An organic emission layer is interposed between the plurality of pixel electrodes and the opposite electrode to emit light.

20 Claims, 8 Drawing Sheets

(56) References Cited

U.S. PATENT DOCUMENTS

| | | |
|---|---|---|
| 2009/0209068 A1 | 8/2009 | Chang et al. |
| 2009/0212288 A1 | 8/2009 | Kim et al. |
| 2009/0295280 A1* | 12/2009 | Yang .......................... 313/504 |
| 2010/0053535 A1 | 3/2010 | Kim et al. |
| 2011/0163318 A1* | 7/2011 | Park et al. ...................... 257/59 |
| 2013/0113843 A1* | 5/2013 | Yamazaki .................... 345/690 |

FOREIGN PATENT DOCUMENTS

| | | | |
|---|---|---|---|
| JP | 2005331665 A | | 12/2005 |
| JP | 2006-128241 | | 5/2006 |
| JP | 2006128241 A | | 5/2006 |
| JP | 2008-112112 A | | 5/2008 |
| JP | 2009237573 A | | 10/2009 |
| KR | 1998-069980 A | | 10/1998 |
| KR | 10-2006-0041797 A | | 5/2006 |
| KR | 10-2006-0047075 A | | 5/2006 |
| KR | 10-2007-0121619 A | | 12/2007 |
| KR | 10-2009-0088575 A | | 8/2009 |
| KR | 2009100920 A | * | 9/2009 |
| WO | WO 2010046833 A1 | * | 4/2010 |

OTHER PUBLICATIONS

Tung et al. "A 200-dpi Transparent a-Si TFT Active-Matrix Phosphorescent OLED Display" SID 05 Digest vol. 36, Issue 1, pp. 1546-1549, May 2005.*

Korean Office action issued by KIPO on Nov. 14, 2011, corresponding to Korean Patent Application No. 10-2010-0001885 and Request for Entry attached herewith.

Japanese Office Action issued by Japanese Patent Office on Mar. 21, 2012 in connection with Japanese Patent Application serial No. 2010-153118, which also claims Korean Patent Application No. 10-2010-0001885 as its priority document and Request for Entry of the Accompanying Office Action attached herewith.

* cited by examiner

ORGANIC LIGHT EMITTING DISPLAY DEVICE

This application claims the benefit of Korean Patent Application No. 10-2010-0001885, filed on Jan. 8, 2010, in the Korean Intellectual Property Office, the disclosure of which is incorporated herein in its entirety by reference.

BACKGROUND OF THE INVENTION

1. Field of the Invention

The general inventive concept relates to an organic light emitting display device.

2. Description of the Related Art

Applications of organic light emitting display devices range from personal portable devices such as MP3 players and mobile phones to television sets, owing to superior characteristics, such as, wide viewing angles, high contrast ratios, short response times, and low amounts of power consumption.

The above information disclosed in this Related Art section is only for enhancement of understanding of the background of the invention and therefore it may contain information that does not form the prior art that is already known to a person of ordinary skill in the art.

SUMMARY OF THE INVENTION

The present invention provides a transparent organic light emitting display device that can prevent distortion of an image transmitted therethrough by preventing light transmitting therethrough from scattering.

According to an aspect of the present invention, there is provided an organic light emitting display device including a substrate in which a plurality of transmitting regions and a plurality of pixel regions are defined, where the plurality of pixel regions are spaced apart from each other by the transmitting regions interposed between the pixel regions; a plurality of thin film transistors formed on a first surface of the substrate and disposed in the pixel regions of the substrate; a passivation layer formed in all the plurality of transmitting regions and the plurality of pixel regions to cover the plurality of thin film transistors, where a first aperture is formed in a location on the passivation layer, which corresponds to an at least part of the plurality of transmitting regions; a plurality of pixel electrodes that are formed on the passivation layer to be electrically connected to the plurality of thin film transistors, respectively, are located in the pixel regions, respectively, and are disposed to overlap and cover the thin film transistors, respectively; an opposite electrode formed to face the plurality of pixel electrodes and to allow light to pass therethrough, and located covering the plurality of transmitting regions and the plurality of pixel regions; and an organic emission layer that is interposed between the plurality of pixel electrodes and the opposite electrode to emit light.

According to another aspect of the present invention, there is provided an organic light emitting display device including a substrate in which a plurality of transmitting regions and a plurality of pixel regions are defined, where the plurality of pixel regions are spaced apart from each other by the transmitting regions interposed between the pixel regions; a plurality of pixel circuit units that are formed on a first surface of the substrate, and are positioned in the plurality of pixel regions, respectively, each of the plurality of pixel circuit units including at least one thin transistor; a first insulating layer formed in all the plurality of transmitting regions and the plurality of pixel regions to cover the plurality of pixel circuit units, the first insulating layer including a third aperture on a location corresponding to at least parts of the plurality of transmitting regions; a plurality of pixel electrodes that are formed on the first insulating layer to be electrically connected to the plurality of pixel circuit units, respectively, and are disposed to overlap and cover the pixel circuit units, respectively; an opposite electrode formed to face the plurality of pixel electrodes and to allow light to pass therethrough, and located covering the plurality of transmitting regions and the plurality of pixel regions; and an organic emission layer that is interposed between the plurality of pixel electrodes and the opposite electrode to emit light.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
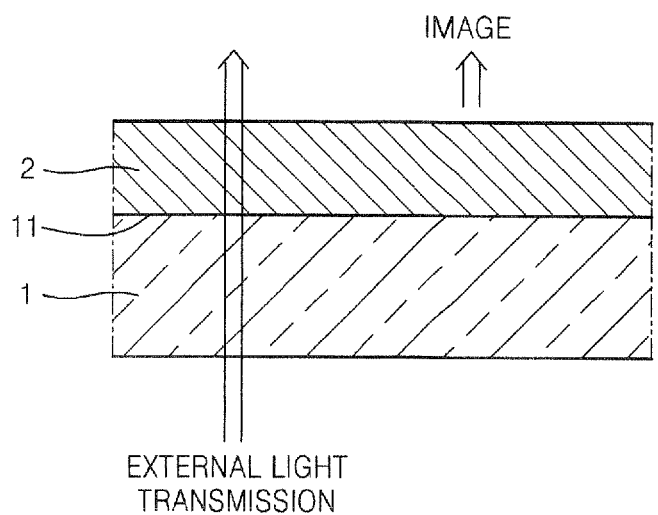
FIG. 1 is a cross-sectional view of an organic light emitting display device according to an embodiment of the present invention.

Applications of organic light emitting display devices range from personal portable devices such as MP3 players and mobile phones to television sets, owing to superior characteristics, such as, wide viewing angles, high contrast ratios, short response times, and low amounts of power consumption.

An organic light emitting display device has the characteristic of being self-light emitting. Further, the weight and thickness of the organic light emitting display device can be reduced since the organic light emitting display device does not require an additional light source, unlike a liquid crystal display device.

Also, an organic light emitting display device can be formed to be a transparent display device by having transparent thin film transistors or transparent organic light emitting devices.

In a transparent display device, when the device is in an off-state, an object or an image positioned on a side of the device opposite to the user is transmitted to the user through not only an organic light emitting diodes but also through spaces between patterns of thin film transistors and various wires. Therefore, a distorted image is transmitted to the user due to the patterns. The reason for this is because gaps between the patterns are only a few nanometers, that is, at a level almost close to the wavelengths of visible light, and thus, the gaps scatters light therethrough.

The present invention will now be described more fully with reference to the accompanying drawings, in which exemplary embodiments of the invention are shown. As those skilled in the art would realize, the described embodiments may be modified in various different ways, all without departing from the spirit or scope of the principles for the present invention.

Recognizing that sizes and thicknesses of constituent members shown in the accompanying drawings are arbitrarily given for better understanding and ease of description, the present invention is not limited to the illustrated sizes and thicknesses.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. Alternatively, when an element is referred to as being "directly on" another element, there are no intervening elements present.

In order to clarify the present invention, elements extrinsic to the description are omitted from the details of this description, and like reference numerals refer to like elements throughout the specification.

In several exemplary embodiments, constituent elements having the same configuration are representatively described in a first exemplary embodiment by using the same reference numeral and only constituent elements other than the constituent elements described in the first exemplary embodiment will be described in other embodiments.

FIG. 1 is a cross-sectional view of an organic light emitting display device constructed according to the principles of the present invention.

Referring to FIG. 1, in the organic light emitting display device according to an embodiment of the present invention, a display unit 2 is formed on a first surface 11 of a substrate 1.

External light sequentially penetrates the substrate 1 and the display unit 2 and then is incident on the organic light emitting display device.

As will be described later, the display unit 2 is formed in order to allow external light to penetrate therethrough. Referring to FIG. 1, the display unit 2 is formed in such a way that an image incident on a lower part of the substrate 1 is transmitted to and displayed on the display unit 2 so that a user may observe the image displayed thereon.

Figure 2:
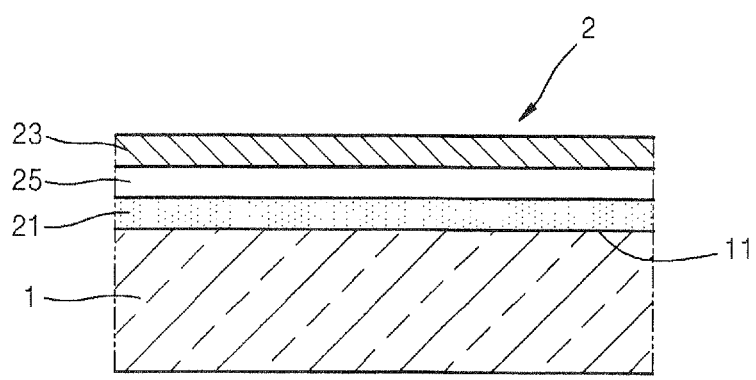
FIG. 2 is a cross-sectional view showing details an embodiment of the organic light emitting display device of FIG. 1, according to the present invention.

FIG. 2 is a cross-sectional view showing details about an embodiment of the organic light emitting display device of FIG. 1, according to the present invention. The display unit 2 includes an organic light emitting unit 21 formed on the first surface 11 of the substrate 1, and a sealing substrate 23 that seals the organic light emitting unit 21.

The sealing substrate 23 may be formed of a transparent material to allow viewing of an image generated by the organic light emitting unit 21 and to prevent external air and moisture from penetrating into the organic light emitting unit 21.

Edges of the sealing substrate 23 and the organic light emitting unit 21 are sealed by a sealant (not shown), and thus, a space 25 is formed between the sealing substrate 23 and the organic light emitting unit 21. The space 25 may be filled with an absorbent or a filler.

Figure 3:
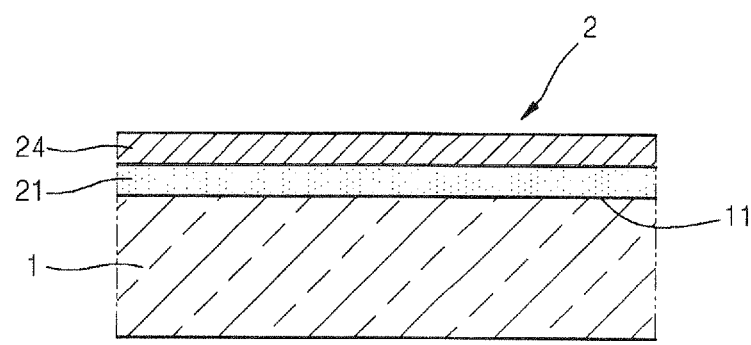
FIG. 3 is a cross-sectional view showing details of another embodiment of the organic light emitting display device of FIG. 1, according to the present invention.

FIG. 3 is a cross-sectional view specifically showing another embodiment of the organic light emitting display device of FIG. 1, according to the principles of the present invention. As shown in FIG. 3, a thin sealing film 24 may be formed on the organic light emitting unit 21 to protect the organic light emitting unit 21 from external air. The thin sealing film 24 may have a structure in which a film formed of an inorganic material, such as silicon oxide or a silicon nitride, and a film formed of an organic material, such as epoxy or polyimide, are alternately stacked, but is not limited thereto, and the thin sealing film 24 may have any transparent thin film type sealing structure.

Figure 4:
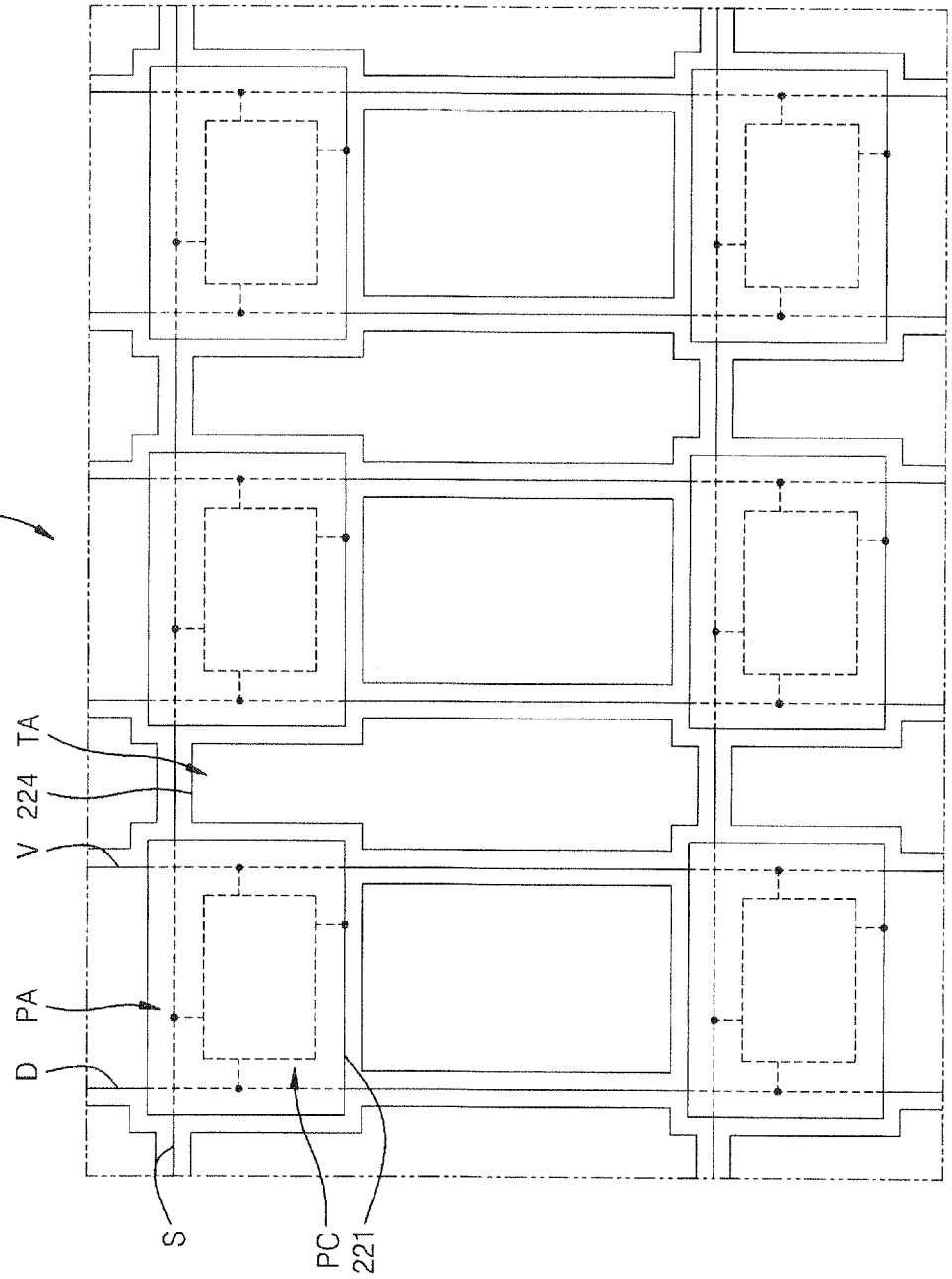
FIG. 4 is a schematic drawing showing an embodiment of the organic emission unit of FIG. 2 or 3, according to the present invention.
Figure 5:
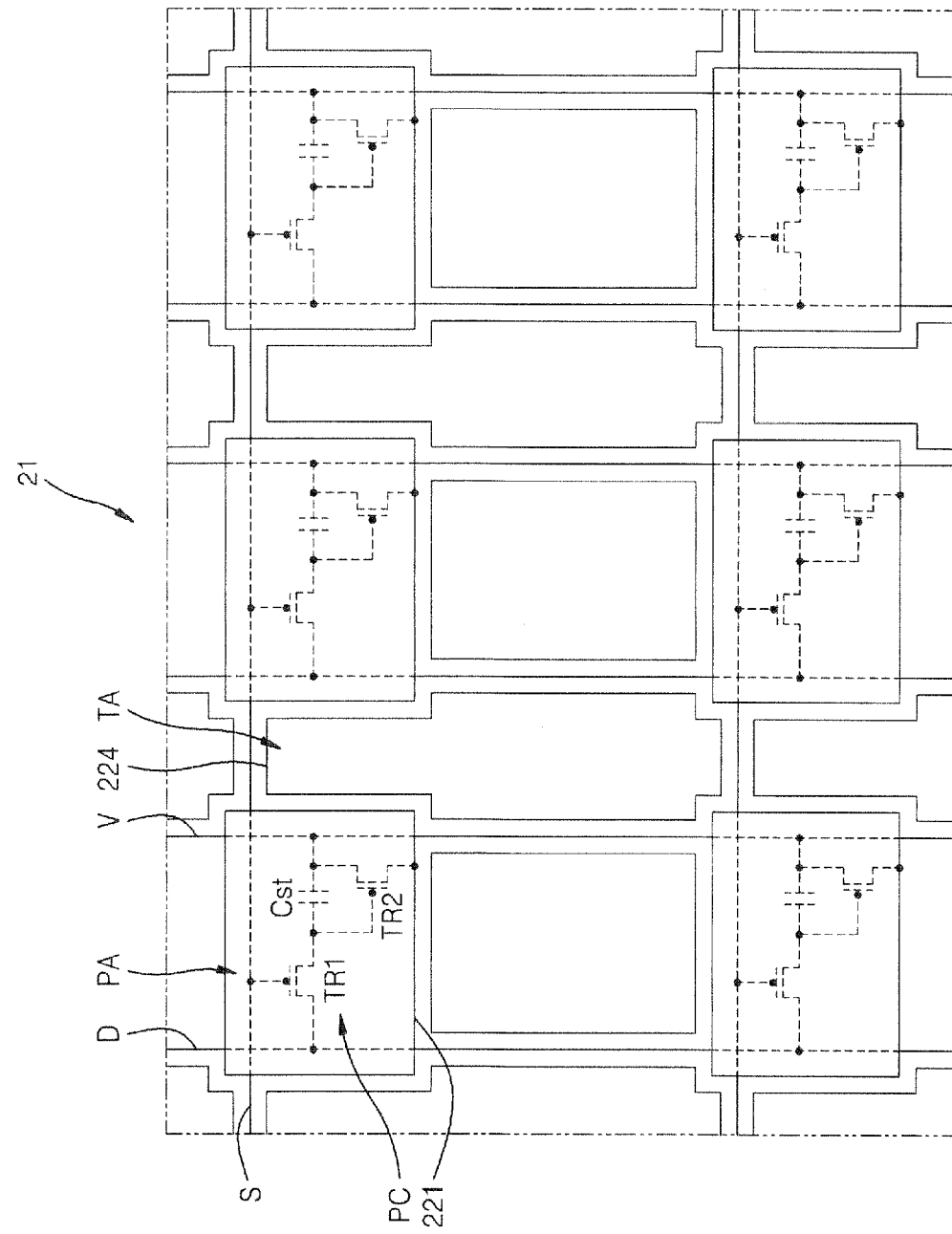
FIG. 5 is a schematic drawing of the organic light emitting unit of FIG. 4, in which an embodiment of a pixel circuit unit according to the present invention is illustrated in detail.

FIG. 4 is a schematic drawing showing an embodiment of the organic emission unit 21 of FIG. 2 or 3, according to the present invention. FIG. 5 is a schematic drawing of the organic light emitting unit of FIG. 4, in which an embodiment of a pixel circuit unit PC according to the present invention is illustrated in detail. Referring to FIGS. 2 through 4, in the implementation of the principles of the present invention, the organic light emitting unit 21 is formed on the substrate 1 on which transmitting regions TA for transmitting external light and pixel regions PA separated from each other and having the transmitting regions TA interposed therebetween are defined.

Each of the pixel regions PA includes a pixel circuit unit PC, and a plurality of conductive lines, such as a scan line S, a data line D, and a driving power line V, are electrically connected to the pixel circuit unit PC. Although not shown, various other conductive lines besides the scan line S, the data line D, and the driving power line V may further be connected to the pixel circuit unit PC according to the configuration of the pixel circuit unit PC.

Referring to FIG. 5, the pixel circuit unit PC includes a first thin film transistor (TFT) TR1 connected to the scan line S and the data line D, a second TFT TR2 connected to the first TFT TR1 and the driving power line V, and a capacitor Cst connected to the first and second TFTs TR1 and TR2. In this case, the first TFT TR1 acts as a switching transistor and the second TFT TR2 acts as a driving transistor. The second TFT TR2 is electrically connected to a pixel electrode 221. In FIG. 5, the first and second TFTs TR1 and TR2 are P-type transistors, but are not limited thereto, and at least one of the first and second TFTs TR1 and TR2 may be an N-type transistor.

According to an embodiment of the present invention, all the conductive lines including the scan line S, the data line D, and the driving power line V are disposed to cross the pixel region PA, and no conductive lines cross only the transmitting regions TA.

The pixel regions PA are light emitting regions. Since the pixel circuit unit PC is located in the light emitting regions and all the conductive lines cross the light emitting regions, a user may recognize mainly the pixel regions PA and see outside view through the transmitting regions TA. Thus, solar light can be prevented from scattering caused by interfering with the patterns of internal devices of the pixel circuit unit PC, thereby preventing external image distortion. Although the conductive lines including the scan line S, the data line D, since the driving power line V are disposed to cross the transmitting region TA between the pixel regions PA, the conductive lines are formed to be very thin, the conductive lines can hardly be observed by the user and have little effect on the overall transmittance of the organic light emitting unit 21, and accordingly, a transparent display can be realized. Also, even if the user may not see the external image as much in regions covered by the pixel regions PA, in consideration of the overall display region, there is little effect on observing the external image since the pixel regions PA are like a plurality of dots regularly arranged on a surface of a transparent glass. That is, this gives the same effect as tinting a transparent glass.

The transmitting regions TA and the pixel regions PA are formed in such a way that a ratio of the area of the transmitting regions TA to the overall area of the transmitting regions TA and the pixel regions PA is between 20% and 90%.

If the ratio of the area of the transmitting regions TA to the overall area of the transmitting regions TA and the pixel regions PA is less than 20%, with respect to FIG. 1, the user can hardly see an object or image displayed on a side opposite to the user due to lack of light that can transmit through the display unit 2 when the display 2 unit is in an off-state. That is, it cannot be said that the display unit 2 is transparent. Even if the ratio of the area of the transmitting regions TA to the overall area of the transmitting regions TA and the pixel regions PA is approximately 20%, the pixel regions PA are present in an island state with respect to the transmitting regions TA, and scattering of light is minimized since all conductive patterns are disposed across the pixel regions PA. Thus, the display unit 2 may be recognized as a transparent display unit by the user. As will be described later, when a transistor included in the pixel circuit unit PC is a transparent TFT such as an oxide semiconductor and an organic light emitting device is a transparent device, the display unit 2 may further be recognized as a transparent display unit. In this case, unlike a conventional transparent display unit, if possible, all conductive patterns are disposed across the pixel regions PA. Accordingly, scattering of light can be prevented, and thus, the user can see an undistorted external image.

If the ratio of the area of the transmitting regions TA to the entire area of the pixel regions PA and the transmitting regions TA is greater than 90%, pixel integrity of the display unit 2 is excessively reduced, and thus, a stable image can hardly be realized through the light emission from the pixel regions PA. That is, as the area of the pixel regions PA is reduced, the amount of light emitted from an organic emission layer must be increased in order to realize an image. However, if the organic light emitting device operates to emit light having a high brightness, the lifetime of the organic light emitting device is rapidly reduced. Also, when the ratio of the area of the transmitting regions TA to the entire are of the pixel regions PA and the transmitting regions TA is greater than 90% while the size of a single pixel region PA is maintained at an appropriate size, the number of pixel regions PA is reduced, and accordingly, the resolution of the organic light emitting device is reduced.

Accordingly, the ratio of the area of the transmitting regions TA to the entire area of the pixel regions PA and the transmitting regions TA may be in a range of 40% to 70%.

When the ratio of the area of the transmitting regions TA to the entire area of the pixel regions PA and the transmitting regions TA is less than 40%, the ratio of the area of the pixel regions PA to the area of the transmitting regions TA is excessively increased. Therefore, the user has a limit in observing an external image through the transmitting regions TA. When the ratio of area of the transmitting regions TA to the entire area of the pixel regions PA and the transmitting regions TA exceeds 70%, there are a lot of limitations in designing the pixel circuit unit PC.

Figure 6:
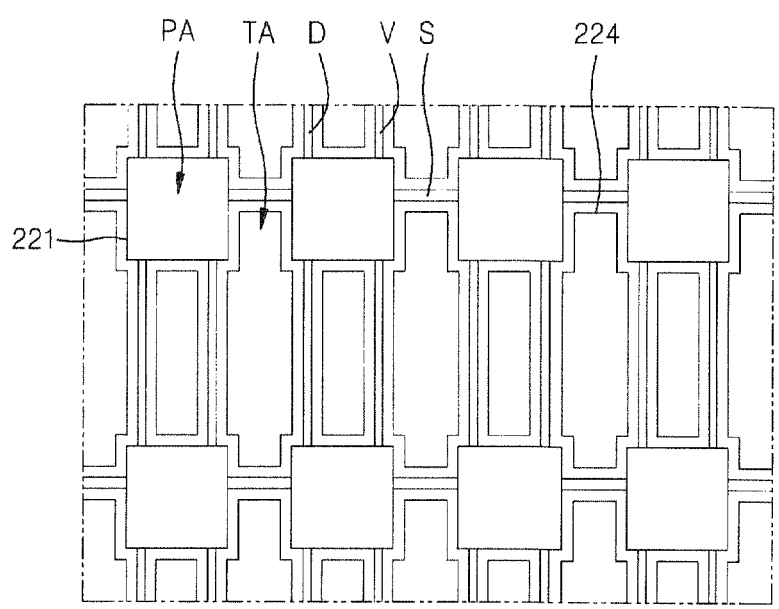
FIG. 6 is a plan view specifically showing an embodiment of the organic light emitting unit of FIG. 5, according to the present invention.

Each of the pixel regions PA includes a pixel electrode 221 that has an area corresponding to the area of pixel regions PA and that is electrically connected to the pixel circuit unit PC. The pixel circuit unit PC overlaps with the pixel electrode 221 so that the pixel circuit unit PC can be covered by the pixel electrode 221. Also, the conductive lines including the scan line S, the data line D, and the driving power line V are disposed to cross the pixel electrode 221. According to an embodiment of the present invention, the pixel electrode 221 may have an area equal to or slightly less than that of the pixel region PA. Accordingly, as shown in FIG. 6, when the user observes the organic light emitting unit 21, the pixel circuit unit PC described above is covered by the pixel electrode 221 and a large portion of the conductive lines is also covered. Therefore, scattering of light is greatly reduced as described above and the user sees a portion of the conductive lines through the transmitting regions TA. Accordingly, the user may observe an undistorted external image.

Figure 8:
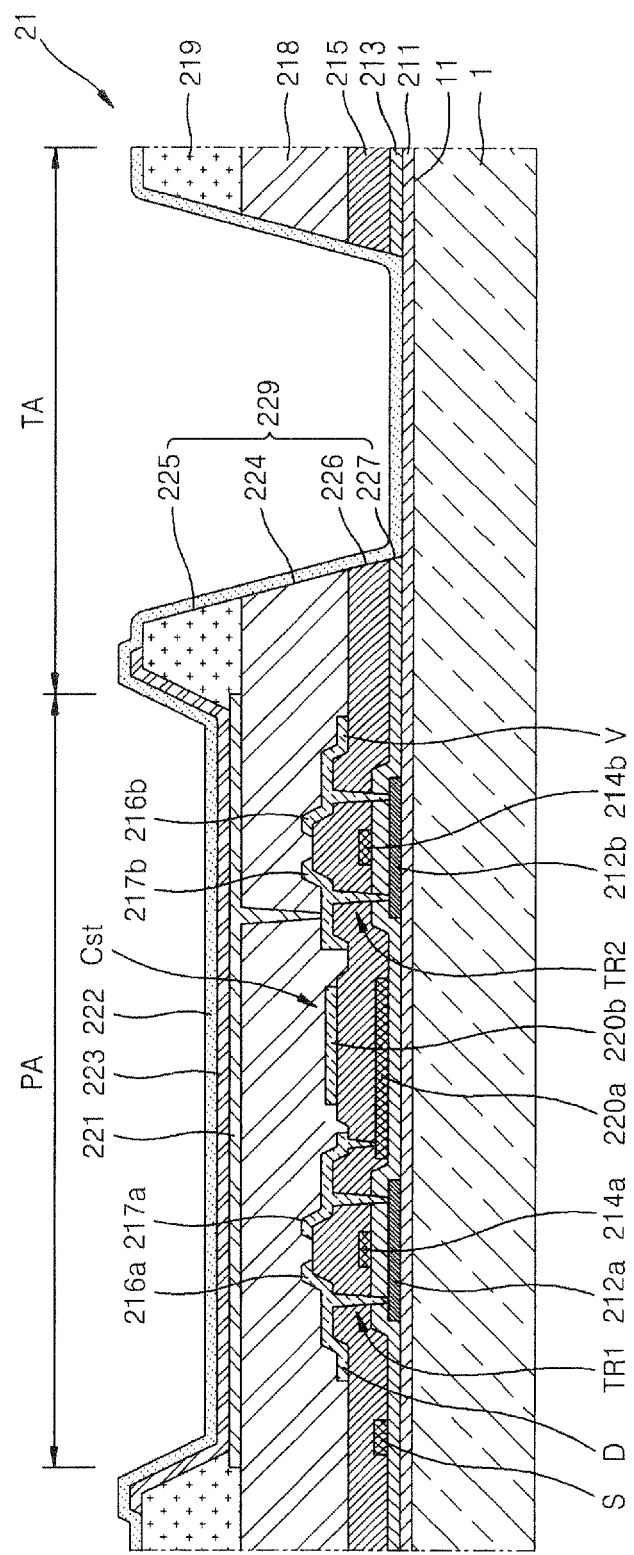
FIG. 8 is a cross-sectional view specifically showing an embodiment of the organic light emitting unit of FIG. 5, according to the present invention.

As illustrated in FIG. 8, in an embodiment of the present invention, an aperture unit 229 is formed in each of a plurality of insulating layers corresponding to at least one part of the transmitting regions TA in order to increase the transmittance of external light of the transmitting regions TA. This will be described in further detail later.

Figure 7:
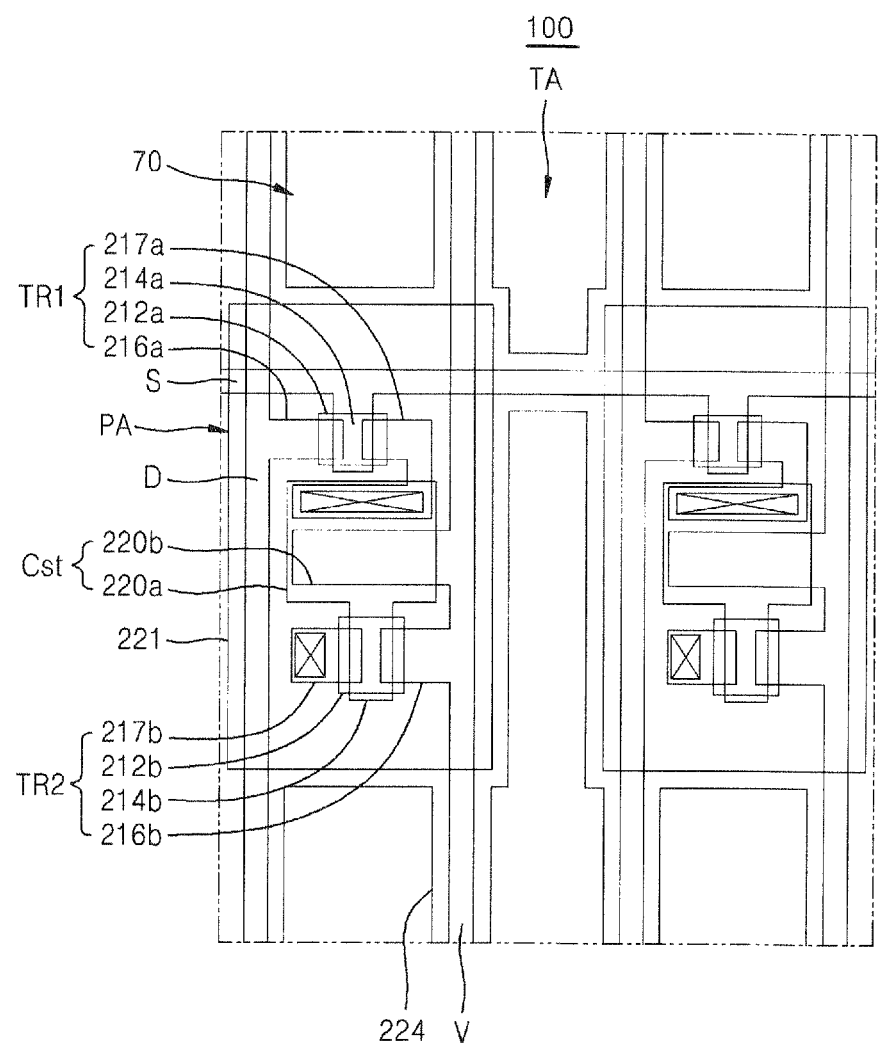
FIG. 7 is a plan view specifically showing an embodiment of the organic light emitting unit of FIG. 6, according to the present invention.

FIG. 7 is a plan view specifically showing an embodiment of the organic light emitting unit 21 of FIG. 6, according to the present invention. FIG. 8 is a cross-sectional view specifically showing an embodiment of the organic light emitting unit of FIG. 6, according to the present invention According to an embodiment of the present invention, referring to FIGS. 7 and 8, a buffer layer 211 is formed on the first surface 11 of the substrate 1, and a first TFT TR1, a capacitor Cst, and a second TFT TR2 are formed on the buffer layer 211.

First, a first semiconductor active layer 212a and a second semiconductor active layer 212b are formed on the buffer layer 211.

The buffer layer 211 prevents impurity elements from penetrating into the organic light emitting unit 21 and planarizes a surface of the organic light emitting unit 21. The buffer layer 211 may be formed of any of various materials that may perform the functions described above, For example, the buffer layer 211 may be formed of an inorganic material, such as a silicon oxide, a silicon nitride, a silicon oxynitride, an aluminum oxide, an aluminum nitride, a titanium oxide, or a titanium nitride; an organic material, such as polyimide, polyester, or acryl; or stacks of these materials. The buffer layer 211 is not an essential element and may not be formed.

The first and second semiconductor active layers 212a and 212b may be formed of polycrystal silicon, but are not limited thereto, and may be formed of a semiconductor oxide. For example, first and second semiconductor active layers 212a and 212b may be formed of a G-I-Z-O layer [$(In_2O_3)_a(Ga_2O_3)_b(ZnO)_c$ layer], where a, b, and c are integers that respectively satisfy a≥0, b≥0, and c>0. When the first and second semiconductor active layers 212a and 212b are formed of a semiconductor oxide, optical transmittance may be increased compared to when the active layers are formed of a silicon semiconductor oxide.

A gate insulating layer 213 is formed on the buffer layer 211 to cover the first and second semiconductor active layers 212a and 212b, and first and second gate electrodes 214a and 214b are formed on the gate insulating layer 213.

An interlayer insulating layer 215 is formed on the gate insulating layer 213 to cover the first and second gate electrodes 214a and 214b. A first source electrode 216a and a first drain electrode 217a and a second source electrode 216b and a second drain electrode 217b are each formed on the interlayer insulating layer 215, and are respectively connected to the first semiconductor active layer 212a and the second semiconductor active layer 212b through contact holes.

Referring to FIG. 8, the scan line S may be simultaneously formed with the first and second gate electrodes 214a and 214b. The data line D may be simultaneously formed with the first source electrode 216a to be connected to the first source electrode 216a. The driving power line V may be simultaneously formed with the second source electrode 216b to be connected to the second source electrode 216b.

In the capacitor Cst, a lower electrode 220a is simultaneously formed with the first and second gate electrodes 214a and 214b, and an upper electrode 220b is simultaneously formed with the first drain electrode 217a.

The structures of the first TFT TR1, the capacitor Cst, and the second TFT TR2 are not limited thereto, and any of various types of TFT and capacitor structures may be employed.

A passivation layer 218 is formed to cover the first TFT TR1, the capacitor Cst, and the second TFT TR2. The passivation layer 218 may be a single insulating layer or multiple insulating layers, an upper surface of which is planarized. The passivation layer 218 may be formed of an inorganic material and/or an organic material.

Referring to FIGS. 7 and 8, a pixel electrode 221 may be formed on the passivation layer 218 to cover the first TFT TR1, the capacitor Cst, and the second TFT TR2. The pixel electrode 221 is connected to the second drain electrode 217b of the second TFT TR2 through a via hole formed in the passivation layer 218. Referring to FIG. 7, a plurality of the pixel electrodes 221 are arranged in the form of islands that are independent from each other.

A pixel defining layer 219 is formed on the passivation layer 218 to cover edges of the pixel electrode 221. An organic emission layer 223 and an opposite electrode 222 are sequentially formed on the pixel electrode 221. The opposite electrode 222 is formed to cover all the pixel regions PA and the transmitting regions TA.

The organic emission layer 223 may be a low-molecular weight organic layer or a high-molecular weight organic layer. If the organic emission layer 223 is a low-molecular weight organic layer, then the organic emission layer 223 may be formed by stacking a hole injection layer (HIL), a hole transport layer (HTL), an emission layer (EML), an electron transport layer (ETL), and an electron injection layer (EIL) in a single structure or a composite structure, and may be formed of any of various materials, such as copper phthalocyanine (CuPc), N,N'-Di(naphthalene-1-yl)-N,N'-diphenyl-benzidine (NPB), or tris-8-hydroxyquinoline aluminum (Alq3). The low-molecular weight organic layer may be formed by vacuum deposition. At this point, the HIL, the HTL, the ETL, and the EIL are common layers and may be commonly applied to red, green, and blue pixels. Accordingly, unlike the organic emission layer in FIG. 7, the common layers may be formed to cover the pixel regions PA and the transmitting regions TA, similar to the opposite electrode 222.

The pixel electrode 221 functions as an anode electrode, and the opposite electrode 222 functions as a cathode electrode. Of course, the polarities of the pixel electrode 221 and the opposite electrode 222 may be reversed.

According to an embodiment of the present invention, the pixel electrode 221 may be a reflection electrode and the opposite electrode 222 may be a transparent electrode. The pixel electrode 221 may include a reflection layer formed of silver (Ag), magnesium (Mg), aluminum (Al), platinum (Pt), palladium (Pd), gold (Au), nickel (Ni), neodymium (Nd), iridium (Ir), chromium (Cr), lithium (Li), and calcium (Ca), or an oxide having a high work function such as ITO, IZO, ZnO, or $In_2O_3$. The opposite electrode 222 may be formed of a metal having a low work function such as Ag, Mg, Al, Pt, Pd, Au, Ni, Nd, Ir, Cr, Li, or Ca. Accordingly, the organic light emitting unit 21 is a top emission type in which light is emitted towards the opposite electrode 222.

When the pixel electrode 221 is a reflection electrode, a pixel circuit unit disposed under the pixel electrode 221 is covered by the pixel electrode 221. Therefore, referring to FIG. 7, at upper outer sides of the opposite electrode 222, the user cannot observe the first TFT TR1, the capacitor Cst, and the second TFT TR2 disposed under the pixel electrode 221, as well as portions of the scan line S, the data line D, and the driving power line V. Accordingly, a clear external image can be seen since distortion of the external image due to each of the patterns that constitute the organic light emitting unit 21 is not generated.

The present invention is not limited thereto and the pixel electrode 221 may be a transparent electrode. In this case, the pixel electrode 221 is formed of an oxide having a high work function, such as ITO, IZO, ZnO, or $In_2O_3$. If the pixel electrode 221 is transparent, at the upper outer sides of the opposite electrode 222, the user can observe the first TFT TR1, the capacitor Cst, and the second TFT TR2 disposed under the pixel electrode 221, as well as portions of the scan line S, the data line D, and the driving power line V. However, even if the pixel electrode 221 is transparent, there is a loss of light since the transmittance of light therethrough cannot be 100%, and the transmittance of external light is further reduced due to the pixel electrode 221 since the conductive patterns are disposed in the region of the pixel electrode 221. Therefore, interference due to the conductive patterns on the external light is reduced. Accordingly, distortion of an external image may be reduced more than when the external light directly enters the conductive patterns.

The passivation layer 218, the gate insulating layer 213, the interlayer insulating layer 215, and the pixel defining layer 219 may be formed as transparent insulating layers. In this case, the substrate 1 may have a transmittance greater than or equal to the total transmittance of the transparent insulating layers.

The passivation layer 218 corresponds to a first insulating layer in the appended claims. The gate insulating layer 213, the interlayer insulating layer 215, and the pixel defining layer 219 correspond to a second insulating layer in the appended claims.

In an embodiment of the present invention, aperture units 229 are respectively formed in at least one of a plurality of insulating layers corresponding to at least one part of the transmitting regions TA in order to increase the transmittance of external light of the transmitting regions TA and to prevent optical interference caused by multilayered transparent insulating layers in the transmitting regions TA, thereby preventing a degradation in color caused by the optical interference.

In order to increase the transmittance of external light of the transmitting regions TA, the transmitting regions TA should be widened or the transmitting regions TA should be formed of a material having a high transmittance. However, there is a restriction in widening the transmitting regions TA due to a restriction in design of the pixel circuit units PC. Thus, the transmitting regions TA should be formed of a material having a high transmittance in order to increase the transmittance of external light of the transmitting regions TA. However, in this case, a number of usable materials having a sufficiently high transmittance is fairly limited.

Accordingly, the aperture units 229 are formed in at least one of insulating layers corresponding to at least one part of the transmitting regions TA.

Referring to FIG. 8, a first aperture 224 is formed in the passivation layer 218 covering the pixel circuit unit PC, and a second aperture 225 is formed in the pixel defining layer 219 on the passivation layer 218. A third aperture 226 and a fourth aperture 227 are formed in the interlayer insulating layer 215 and the gate insulating layer 213, respectively. The aperture units 229 may be formed in such a way that the first to fourth apertures 224 to 227 are connected to one another.

The aperture units 229 may be formed by using a mask when the insulating layers are formed so that a location where the aperture units 229 are to be formed may not be covered by the insulating layers or may be formed by removing parts of the insulating layers by wet etching or other patterning methods.

The aperture unit 229 may be formed as wide as possible as long as the apertures 229 do not interrupt the scan line S, the data line D, and the driving power line V.

Figure 9:
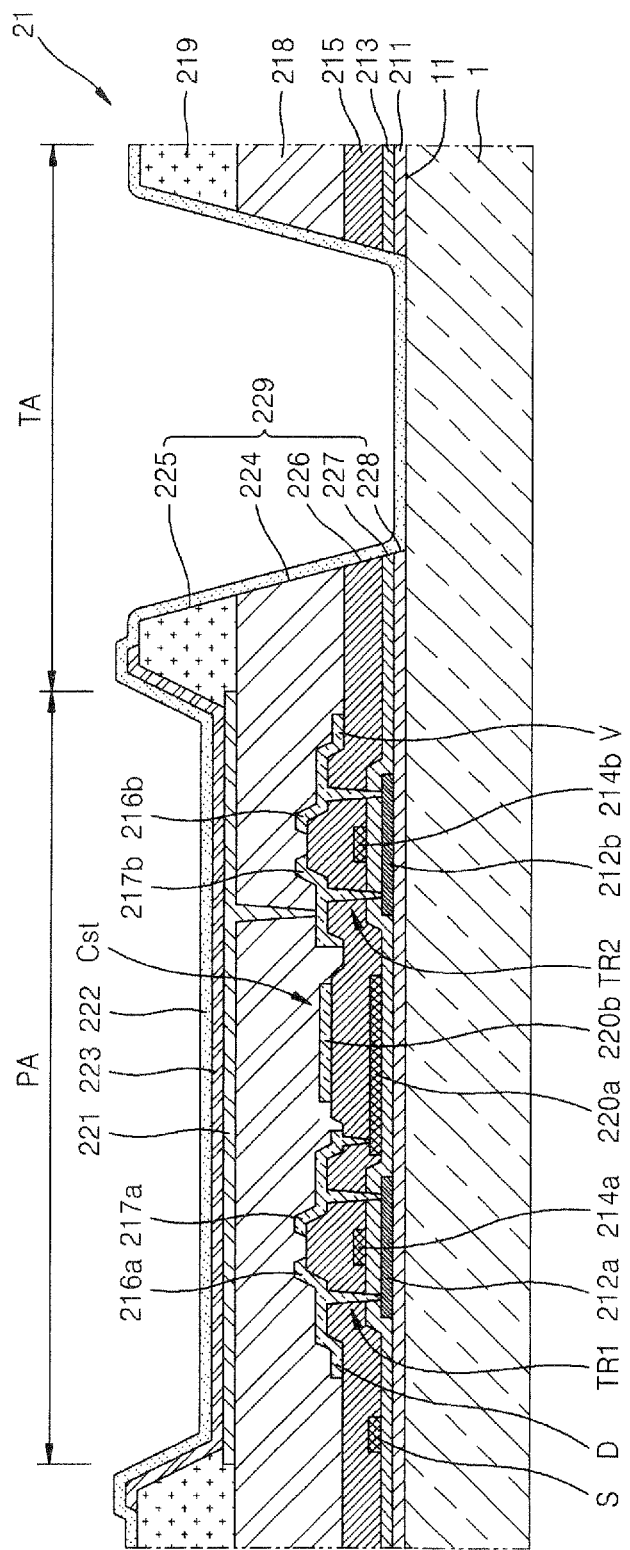
FIG. 9 is a cross-sectional view specifically showing another embodiment of the organic light emitting unit of FIG. 5, according to the present invention.

In FIG. 8, the aperture unit 229 is not formed in the buffer layer 211 in order to prevent impurities from penetrating into the substrate 1. As illustrated in FIG. 9, if necessary, a fifth aperture 228 may be formed in the buffer layer 211 to be connected to the fourth aperture 227.

The aperture units 229 are not limited by FIGS. 8 and 9 and may include at least one of the first to fifth apertures formed in the insulating layers in the transmitting region TA, i.e., the pixel defining layer 219, the passivation layer 218, the interlayer insulating layer 215, the gate insulating layer 213, and the buffer layer 211.

If the aperture unit 229 is formed in the transmitting region TA as described above, the optical transmittance of the transmitting region TA may be increased and an external image can thus be further clearly observed by the user.

The present invention provides a transparent organic light emitting display device that can prevent distortion of an image transmitted therethrough by preventing light transmitting therethrough from scattering.

Also, the optical transmittance of a transmitting region may be improved. Also, it is possible to prevent optical interference caused by multilayered transparent insulating layers in the transmitting region, thereby preventing a degradation in color caused by the optical interference.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting display device comprising:
   a substrate in which a plurality of transmitting regions and a plurality of pixel regions are defined, where the plurality of pixel regions are spaced apart from each other by the transmitting regions interposed between the pixel regions;
   a plurality of thin film transistors formed on a first surface of the substrate and disposed in the pixel regions of the substrate;
   a passivation layer formed in all the plurality of transmitting regions and the plurality of pixel regions to cover the plurality of thin film transistors, where a first aperture is formed in a location on the passivation layer, which corresponds to an at least part of the plurality of transmitting regions;
   a plurality of pixel electrodes that are formed on the passivation layer to be electrically connected to the plurality of thin film transistors, respectively, that are located in the pixel regions, respectively, and that are disposed to overlap and cover the thin film transistors, respectively;
   an opposite electrode formed to face the plurality of pixel electrodes and to allow light to pass through the opposite electrode, and located to cover the plurality of transmitting regions and the plurality of pixel regions; and
   an organic emission layer that is interposed between the plurality of pixel electrodes and the opposite electrode to emit light,
   wherein a region where the first aperture is formed, is not covered by the passivation layer.

2. The organic light emitting display device of claim 1, wherein each of the plurality of pixel electrodes has an area identical to that of one of the plurality of pixel regions.

3. The organic light emitting display device of claim 1, further comprising:
   a plurality of conductive lines electrically connected to the plurality of thin film transistors, respectively, wherein all of the conductive lines are arranged to overlap the plurality of pixel electrodes, respectively.

4. The organic light emitting display device of claim 1, wherein a ratio of a total area of the plurality of transmitting regions to a total area of the plurality of pixel regions and the plurality of transmitting regions is within a range extending between approximately 20% and approximately 90%.

5. The organic light emitting display device of claim 1, wherein the passivation layer is formed of a transparent material.

6. The organic light emitting display device of claim 5, wherein the substrate has a transmittance equal to or greater than that of the passivation layer.

7. The organic light emitting display device of claim 1, wherein a plurality of insulating layers are formed on a location corresponding to each of the plurality of transmitting regions, where at least one of the insulating layers comprises a second aperture to correspond at least one part of the plurality of transmitting regions.

8. The organic light emitting display device of claim 7, wherein the second aperture is connected to the first aperture.

9. The organic light emitting display device of claim 1, wherein at least one of the pixel electrodes and the opposite electrode is a transparent electrode.

10. An organic light emitting display device comprising:
    a substrate in which a plurality of transmitting regions and a plurality of pixel regions are defined, where the plurality of pixel regions are spaced apart from each other by the transmitting regions interposed between the pixel regions;
    a plurality of pixel circuit units that are formed on a first surface of the substrate, and are positioned in the plurality of pixel regions, respectively, each of the plurality of pixel circuit units comprising at least one thin transistor;
    a first insulating layer formed in all the plurality of transmitting regions and the plurality of pixel regions to cover the plurality of pixel circuit units, the first insulating layer comprising a third aperture on a location corresponding to at least parts of the plurality of transmitting regions;
    a plurality of pixel electrodes that are formed on the first insulating layer to be electrically connected to the plurality of pixel circuit units, respectively, and that are disposed to overlap and cover the pixel circuit units, respectively;
    an opposite electrode formed to face the plurality of pixel electrodes and to allow light to pass through the opposite electrode, and located to cover the plurality of transmitting regions and the plurality of pixel regions; and an organic emission layer that is interposed between the plurality of pixel electrodes and the opposite electrode to emit light, wherein a region where the third aperture is formed, is not covered by the first insulating layer.

11. The organic light emitting display device of claim 10, wherein the plurality of pixel electrodes are formed on the same locations where the plurality of pixel regions are formed, respectively.

12. The organic light emitting display device of claim 10, further comprising a plurality of conductive lines electrically connected to the plurality of pixel circuit units, respectively, wherein all the conductive lines are arranged to cross the plurality of pixel regions, respectively.

13. The organic light emitting display device of claim 10, wherein a ratio of a total area of the plurality of transmitting regions to a total area of the plurality of pixel regions and the plurality of transmitting regions is within a range between approximately 20% and approximately 90%.

14. The organic light emitting display device of claim 10, wherein the first insulating layer is formed of a transparent material, and a plurality of second insulating layers formed of a transparent material are further arranged in the plurality of transmitting regions and the plurality of pixel regions.

15. The organic light emitting display device of claim 14, wherein the substrate has a transmittance equal to or greater than a total transmittance of the first insulating layer and the plurality of second insulating layers.

16. The organic light emitting display device of claim 15, wherein at least one of the plurality of second insulating layers comprises a fourth aperture on a location corresponding to at least parts of the plurality of transmitting regions.

17. The organic light emitting display device of claim 16, wherein the fourth aperture is connected to the third aperture.

18. The organic light emitting display device of claim 10, wherein at least one of the pixel electrodes and the opposite electrode is a transparent electrode.

19. An organic light emitting display device comprising:

a substrate in which a plurality of transmitting regions and a plurality of pixel regions are defined, where the plurality of pixel regions are spaced apart from each other by the transmitting regions interposed between the pixel regions;

a plurality of thin film transistors formed on a first surface of the substrate and disposed in the pixel regions of the substrate;

a passivation layer formed in all the plurality of transmitting regions and the plurality of pixel regions to cover the plurality of thin film transistors, where a first aperture is formed in a location on the passivation layer, which corresponds to an at least part of the plurality of transmitting regions;

a plurality of pixel electrodes that are formed on the passivation layer to be electrically connected to the plurality of thin film transistors, respectively, are located in the pixel regions, respectively, and are disposed to overlap and cover the thin film transistors, respectively;

an opposite electrode formed to face the plurality of pixel electrodes and to allow light to pass the opposite electrode, and located covering the plurality of transmitting regions and the plurality of pixel regions; and an organic emission layer that is interposed between the plurality of pixel electrodes and the opposite electrode to emit light, wherein a ratio of a total area of the plurality of transmitting regions to a total area of the plurality of pixel regions and the plurality of transmitting regions is within a range between approximately 20% and approximately 90%, wherein a region where the first aperture is formed, is not covered by the passivation layer.

20. The organic light emitting display device of claim 19, wherein the ratio of the total area of the plurality of transmitting regions to the total area of the plurality of pixel regions and the plurality of transmitting regions is within a range between approximately 40% and approximately 70%.

* * * * *